United States Patent [19]
Koiwa et al.

[11] Patent Number: 5,658,157
[45] Date of Patent: Aug. 19, 1997

[54] FOLDING DATA COMMUNICATION DEVICE

[75] Inventors: Kazuo Koiwa; Junichi Nakao, both of Tokyo, Japan

[73] Assignee: NEC Corporation, Tokyo, Japan

[21] Appl. No.: 550,193

[22] Filed: Oct. 30, 1995

[30] Foreign Application Priority Data

Oct. 31, 1994 [JP] Japan .................................. 6-290637

[51] Int. Cl.⁶ ............................................... H01R 3/00
[52] U.S. Cl. ........................................................ 439/165
[58] Field of Search ................................ 439/164, 165, 439/31, 76.1

[56] References Cited

U.S. PATENT DOCUMENTS

| | | |
|---|---|---|
| 3,227,856 | 1/1966 | Hurko et al. ............................ 439/31 |
| 5,177,672 | 1/1993 | Ito ............................................. 439/164 |
| 5,394,297 | 2/1995 | Toedter ..................................... 439/165 |

*Primary Examiner*—Neil Abrams
*Assistant Examiner*—Eugene G. Byrd
*Attorney, Agent, or Firm*—Scully, Scott, Murphy & Presser

[57] ABSTRACT

It is a folding data communication device having a structure where a slot insertion section (2) to be inserted into an expansion slot of an information processing device is rotatably coupled to a body (3), and performing transmission or receiving of data through radio communication alone or by connecting to the information processing device.

The slot insertion section (2) comprises an PC card section (5) and an interface connector (13). The body (3) is provided with a housing (4) for housing the slot insertion section. The housing (4) is formed with a connector protection cover (6) contacting and protecting the interface connector (13) when the slot insertion section is folded. The connector protection cover (6) is formed with an elastic conductive material on its surface.

With such arrangement, the folding data communication device can effectively prevent damage of the PC card section (5) and the interface connector (13), and also is improved for its operability and portability.

10 Claims, 6 Drawing Sheets

1

FOLDING DATA COMMUNICATION DEVICE

BACKGROUND OF THE INVENTION

The present invention relates to a data communication device which is connected to an information processing device such as a personal computer for transmission and receiving of data through radio communication, and, more particularly, to a data communication device in which a body is foldably combined with an PC card section which is inserted into an expansion slot of the information processing device.

Recently, a data communication device is being used which is connected to a information processing device such as a personal computer for transmission and receiving of data through radio communication.

A conventional data communication device has a rotatable arrangement in which a slot insertion section is combined with a body by a hinge, the slot insertion section comprising an PC card section in which an interface connector is formed, the body being mounted with a communication device and an antenna.

In use of the device, the slot insertion section is inserted into an expansion slot of the information processing device, and the interface connector is connected to an PC card connector in the slot. After completion of use, the slot insertion section is disconnected from the slot, and rotated and folded in the body.

However, in this data communication device, since the interface connector remains exposed when the folded device is carried, there are such problems as destruction of internal circuitry because of static electricity, destruction of external shock or the like, or defective contacts because of intrusion of foreign materials such as dust. In addition, because the PC card is thin in its thickness, it is easily damaged while it is carried.

SUMMARY OF THE INVENTION

The first object of the present invention is to prevent effectively destruction or damage on an interface connector and an PC card section with a simple arrangement when a folding data communication device is carried while the slot insertion section and the body are folded.

In addition, the second object of the present invention is to improve portability of a folding data communication device not in use.

The folding data communication device to attain these objects rotatably connects a body and a slot insertion section.

The body comprises a board mounting electronic circuitry, and a housing which houses the slot insertion section when it is rotated and folded.

The slot insertions section comprises an PC card section and an interface connector.

This folding data communication device can transmit and receive data when the slot insertion section is inserted into an expansion slot of an information processing device such as a personal computer to connect the interface connector to an PC card connector. This device alone may also have a function to perform transmission and receiving of data. After completion of use, the slot insertion section is disconnected from the slot, and folded in an opening formed in the body for housing. Thus, the interface connector and the PC card are not damaged, and portability is also improved.

BRIEF DESCRIPTION OF THE DRAWINGS

The above and other objects, features and advantages of the present invention will become apparent from the following detailed description when taken with the accompanying drawings, in which:

FIG. 4A is a perspective view showing a connector protection cover used in the first embodiment of the present invention, while

DETAILED DESCRIPTION OF THE PREFERRED EMBODIMENTS

Figure 1:
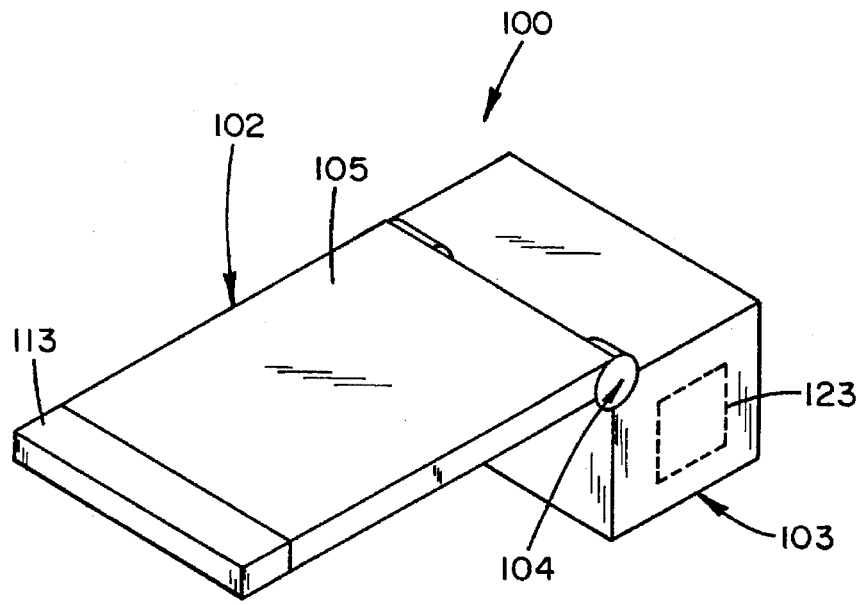
FIG. 1 is a perspective view showing a conventional folding data communication device.

First, for reference purposes, a conventional folding data communication device is described by using FIG. 1.

In the data communication device 100 shown in FIG. 1, a slot insertion section 102 is rotatably coupled to a body 103 by a hinge 104. The slot insertion section 102 consists of an PC card section 105 in which a female interface connector 113 is formed, and the body 103 has a board (not shown) mounting electronic circuitry, and an antenna 123.

When the device is used, the folded slot insertion section 102 and the body 103 are rotated to the state as shown in FIG. 1, and then the slot insertion section 102 is inserted into the expansion slot of an information processing device. At the moment, the interface connector 113 is connected to a male PC card connector in the slot so that transmission or receiving is enabled. After use, the slot insertion section 102 is removed from the slot, and folded through rotation toward the top or side face of the body 103.

However, since the interface connector 113 is exposed when the device 100 is folded and carried, there are such problems as destruction of internal circuitry because of static electricity, destruction of external shock or the like, or defective contacts because of intrusion of foreign materials such as dust. In addition, because the PC card section 105 is thin in its thickness, there is a high possibility that it is damaged while it is carried.

Now, the embodiments of the folding data communication device of the present invention are described.

First, the arrangement of the device is described by using FIGS. 2, 3, 4A and 4B. In the folding data communication device shown in FIG. 2, a slot insertion section 2 to be inserted into an expansion slot (not shown) of an information processing device is rotatably coupled to a body 3 by a shaft 34.

Figure 3:
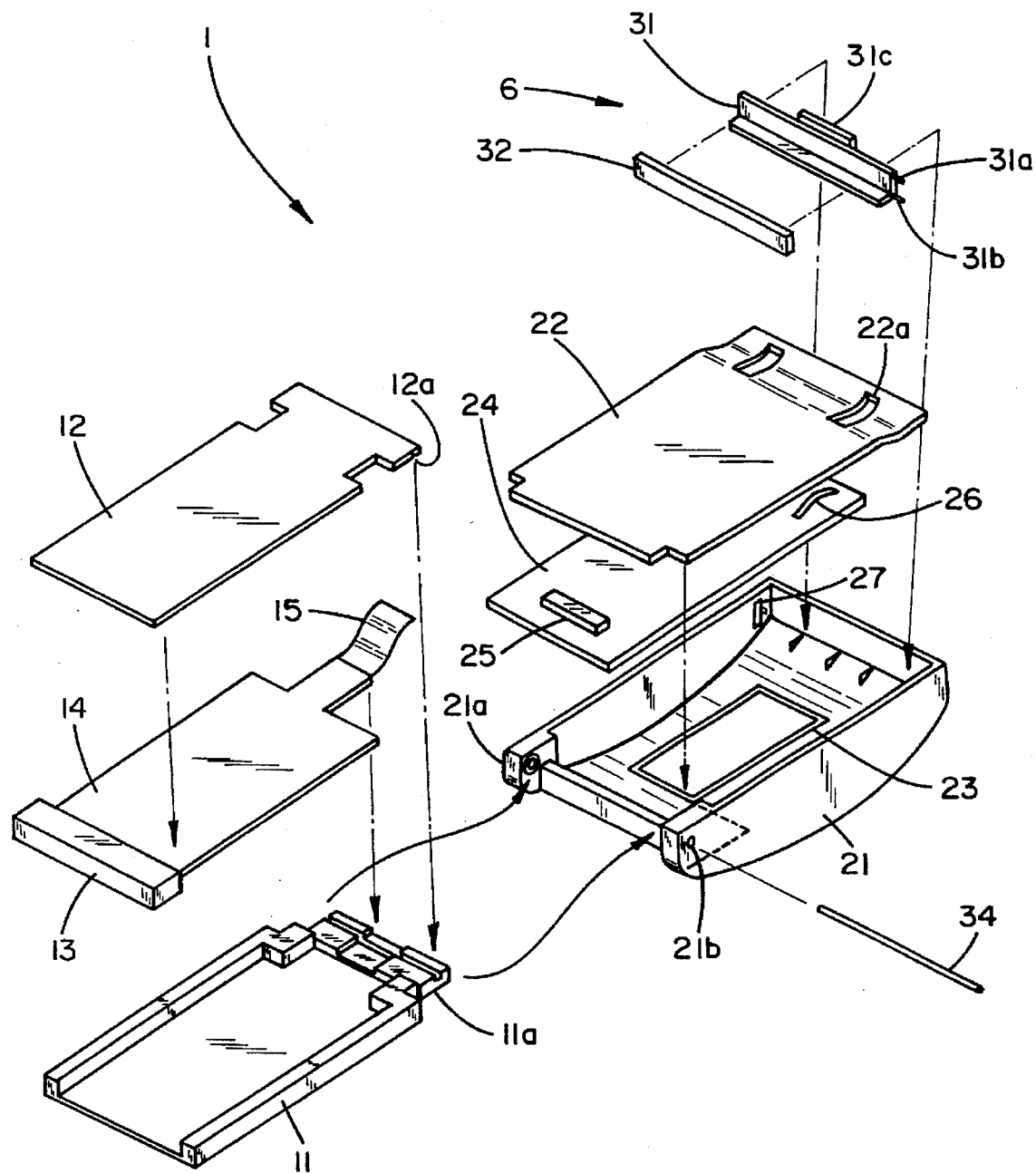
FIG. 3 is an exploded perspective view of the first embodiment of the present invention.

The coupling can be constituted as shown in FIG. 3 by holding both sides of the shaft 34, which passes through holes 21a and 21b in the sides of the body, between linear recesses 12a and 11a formed in the body mounting section of the slot insertion section 3. The coupling may be constituted by a hinge structure.

Preferably, the slot insertion section 2 and the body 3 can be overlapped each other when they are folded, and can be rotated in a range in which they are at least horizontal when they are extended.

The slot insertion section 2 comprises the PC card section 5 constituted by holding a circuit board 14 between a frame 11 and a panel 12, and an interface connector 13 mounted on the circuit board. Data is transmitted or received by connecting the interface connector 13 to an PC card connector in the expansion slot of the information processing device.

Terminals on the circuit board 14 connect the shaft 34 to electrically connect the circuitry in the body 3. A flexible printed board 15 connects a connector 25 provided on a circuit board 24 and the circuit board 14 to electrically connects both circuit boards 14 and 24.

The body 3 comprises, as shown in FIG. 3, a case 21 opened upward, an antenna 23 mounted on the bottom of the case 21, the circuit board 22, and a cover 22 mounted over the circuit board 24. However, the antenna is not necessarily installed on the bottom of the case 21 in the body 3, but may be installed in the slot insertion section 2 or on both the body 3 and the slot insertion section 2. The circuit board 24 is mounted with electronic components constituting a communication device. The communication device may be arranged to have a function enabling transmission and receiving of data with the data communication device alone in addition to the function for performing transmission and receiving of data by connecting to the information processing device.

An opening in the case 21 is formed to a shape corresponding to the outer shape of the slot insertion section 2 so that the slot insertion section 2 is housed therein when it is folded. The antenna 23 electrically connects to one of the hole 21a or 21b provided in the case 21, and connects to the circuit board 14 through the shaft 34.

The case 21 is provided with a connector protection cover 6. The case 21 is placed at a location opposite to the location where the slot insertion section 2 in the case 21 is coupled, and at a location where it contacts the interface connector 13 when the slot insertion section 2 and the body 3 are folded. While the interface connector 13 may be caused to directly contact the inner surface of the PC card housing 4, it is desirable to provide a connector protection cover 6 so as to assure protection.

The connector protection cover 6 is made of a plate member, and, in this embodiment, a connector cover 31 made of a conductive material, and conductive rubber 32 formed on its surface. The connector protection cover 6 is desirable to have conductivity to protect the interface connector 13 by preventing static electricity. In addition, it is also desirable that the area of the connector protection cover 6 contacting the connector 13 is formed by a material with elasticity to absorb shock. Instead of the conductive rubber 32 of the embodiment, it may be a conductive film formed on a nonconductive elastic material.

Figure 4A:
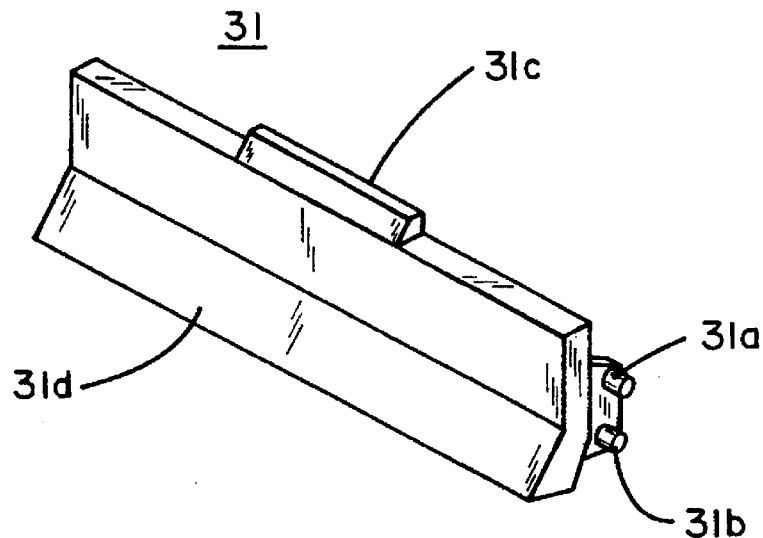

Formed on each end of the connector cover 31, as shown in FIGS. 3 and 4A, are two pivots 31a and 31b which project in the longitudinal direction of the connector cover 31. The two shafts are slidably inserted into a guide groove 27 on the inner surface of the case 21. Therefore, the connector protection cover 6 can move along the guide groove 27.

It is desirable to form the pivot 31a closer to the connector protection cover 6 than the pivot 31b so that the connector protection cover 6 is vertically locked in the case 21.

The connector protection cover 6 has a manipulation section 31c on the upper end of the connector cover 31 to make movement easier. In addition, an inclined section 31d slightly inclined toward the slot insertion section 2 is formed on the lower region of the connector cover 31. The inclined section 31d holds the bottom of the interface connector 13 when the slot insertion section 2 is housed.

Figure 4B:
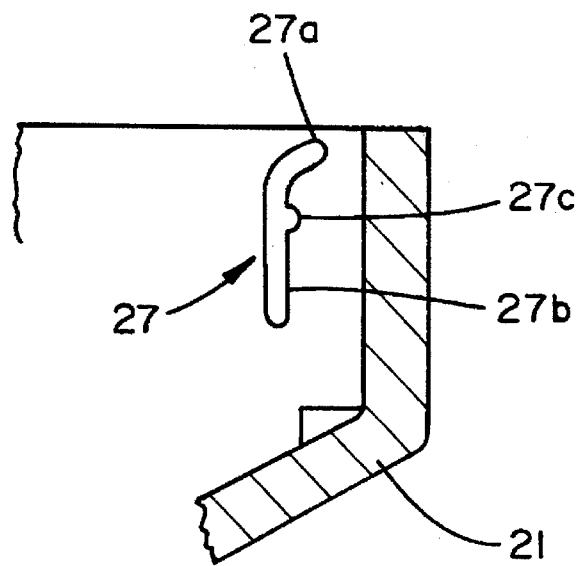
FIG. 4B is a partial sectional view showing a guide groove on which the connector protection cover is mounted.

FIG. 4B shows the shape of the guide groove 27. The guide groove 27 has a width in which the pivots 31a and 31b can move. It also has a linear section 27b at its lower region, a curved section 27a at its upper region (curved opposite to the slot insertion section 2), and a recess 27c at its intermediate region. The pivot 31a moves on the curved section 27a, and the pivot 31b moves on the linear section 27b. In addition, the connector protection cover 6 is locked in the case 21 as the pivot 31a engages the recess 27c.

Two spring terminals 26 made of a thin plate are provided at a location corresponding to the connector cover 31 on the circuit board 24. The spring terminal 26 projects through a terminal hole 22a formed in the cover 22, and contacts the lower end of the connector cover 31 to serve as a support member for pushing the lower end upward. In addition, the spring terminal 26 also serves to mount the conductive rubber 32 on the ground of the electronic circuit on the circuit board 24 through the connector cover 31.

The frame 11, the panel 12, the case 21, and the cover 22 used in the above arrangement are desired to be made of resin, but may be made of metal. When metal is used, it is necessary to suitably select the arrangement and location of the antenna 23. Assembly may be attained by using typical adhesives.

The operation of the folding data communication device with the above arrangement is described.

Figure 5A:
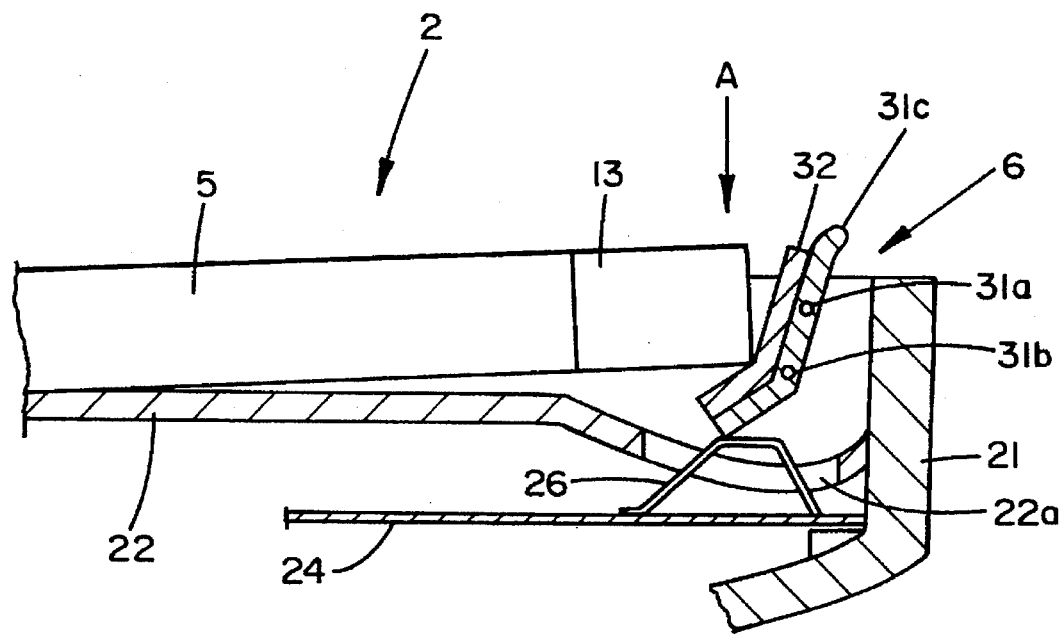
FIGS. 5A and 5B are partial sectional views showing actions for housing and extending the slot insertion section, respectively.
Figure 5B:
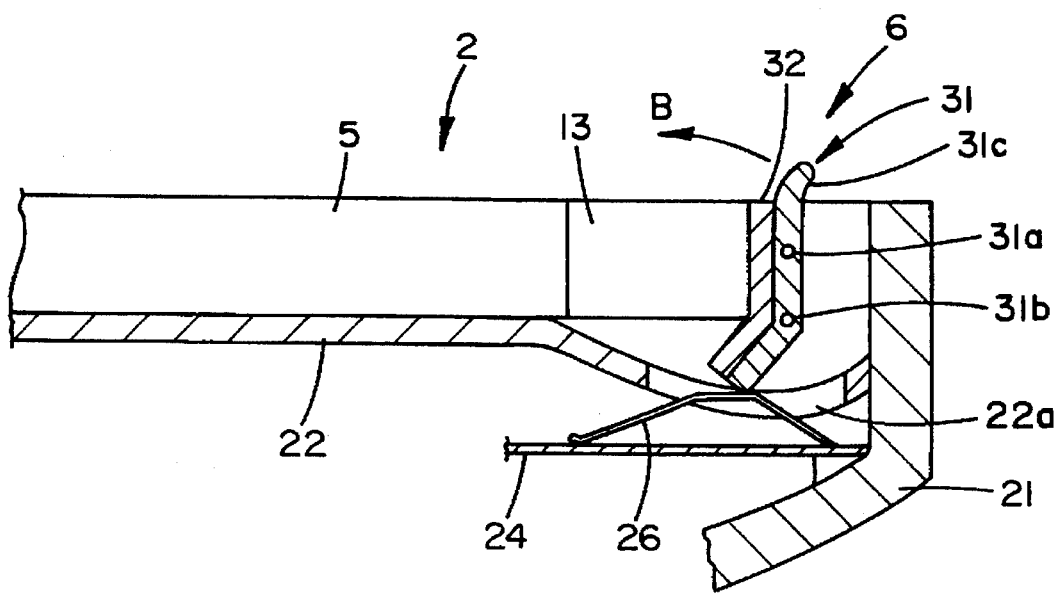

FIGS. 5A and 5B are partial sectional views showing operations in housing and expanding the slot insertion section, respectively. FIG. 5B shows a state where the slot insertion section 2 and the body 3 are folded around the shaft 34, and housed in the housing 4 of the case 21.

In this state, because the lower end of the interface connector 13 mounted at the end of the PC card section 5 pushes the connector protection cover 6 downward, and the pivot 31a provided on the connector cover 31 engages in the recess 27c in the guide groove 27, the position of the connector protection cover 6 is fixed, and the slot insertion section 2 is held in the housing 4. In this state, because the front end of the interface connector 13 is pressed against the conductive rubber 32 provided on the connector cover 31, the interface connector 31 is closed and protected.

Next, the case where the slot insertion section 2 is expanded is described.

If the manipulation section 31c provided on the connector cover 31 is pulled in the direction B shown in FIG. 5B, the pivot 31a can be disengaged from the recess 27c in the guide groove 27. Then, the connector protection cover 6 is pushed up by the resilient action of the spring terminal 26, and the top surface of the interface connector 13 is also raised upward. In this state, the interface connector 13 is not fixed on the conductive rubber 32 so that the slot insertion section 2 can be easily expanded around the shaft 34.

After use, the slot insertion section 2 and the body 3 are again folded to house the slot insertion section 2 in the housing 4 in the case 21. That is, when the interface connector 13 at the front end of the slot insertion section 2 is placed on the connector protection cover 6, and pushed in the direction A shown in FIG. 5A, the connector protection cover 6 is pushed down to cause the pivot 31a to engage the recess 27c in the guide groove 27 so that the position of the connector protection cover 6 is fixed. As the result, the slot insertion section 2 is held and fixed in the housing 4 as shown in FIG. 5B, and the front end of the interface connector 13 is closed and held by the conductive rubber.

Next, another embodiment of the folding data communication device of the present invention is described.

Figure 6:
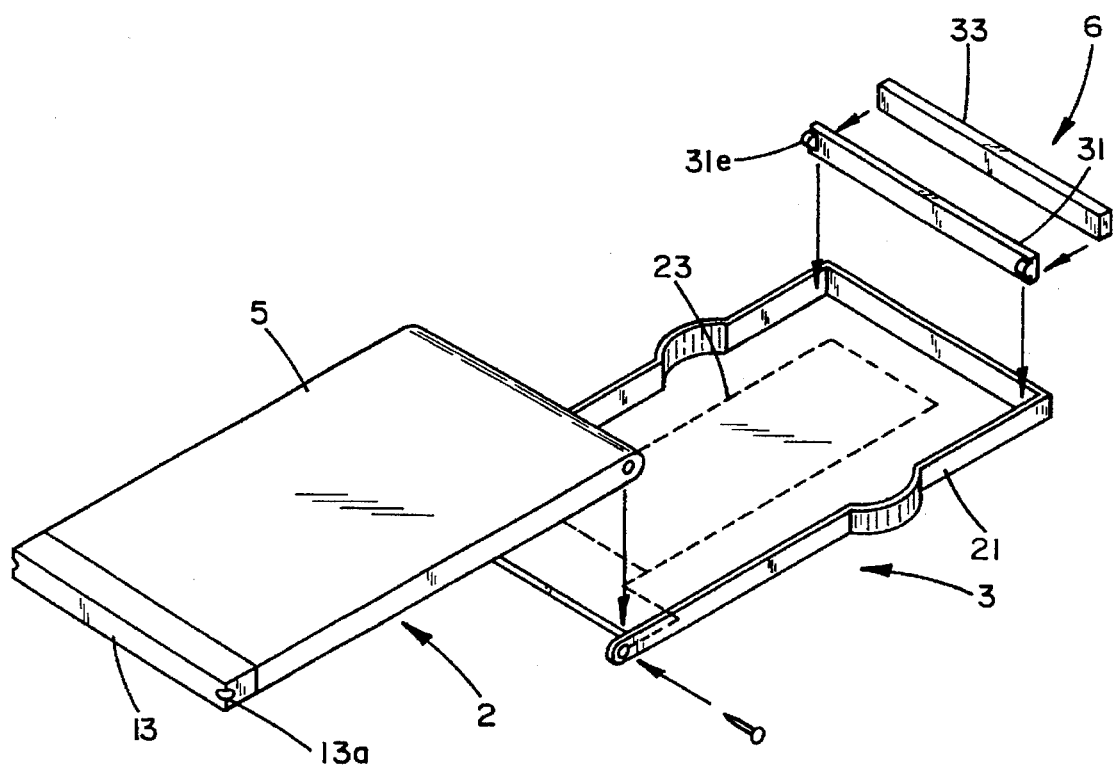
FIG. 6 is an exploded perspective view showing a second embodiment of the present invention.

FIG. 6 is a exploded perspective view showing another embodiment of the invention. A recess 13a is formed in each end at the front end of the interface connector 13 at the end of the PC card section 5, and a projection 31e is formed in the connector cover 31 at a location corresponding to the recess 13a. An elastic rubber dumper 33 is positioned on the back surface of the connector cover 31. In addition, a curved section is formed on each side of the case 21 at a location corresponding to each side of the PC card section.

Figure 7A:
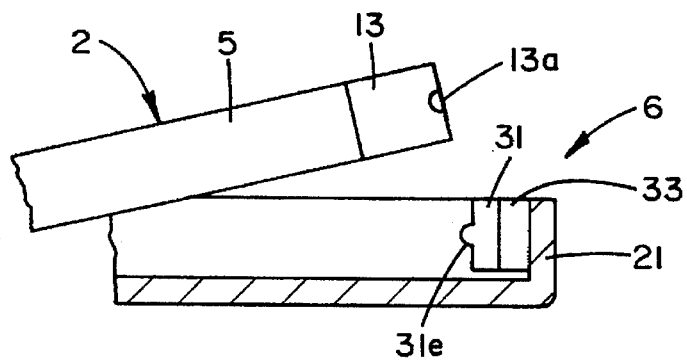
FIGS. 7A and 7B are partial sectional views of the second embodiment of the present invention showing actions for housing and extending the slot insertion section, respectively.
Figure 7B:
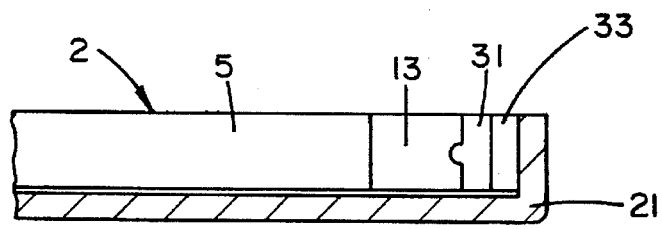
Figure 2:
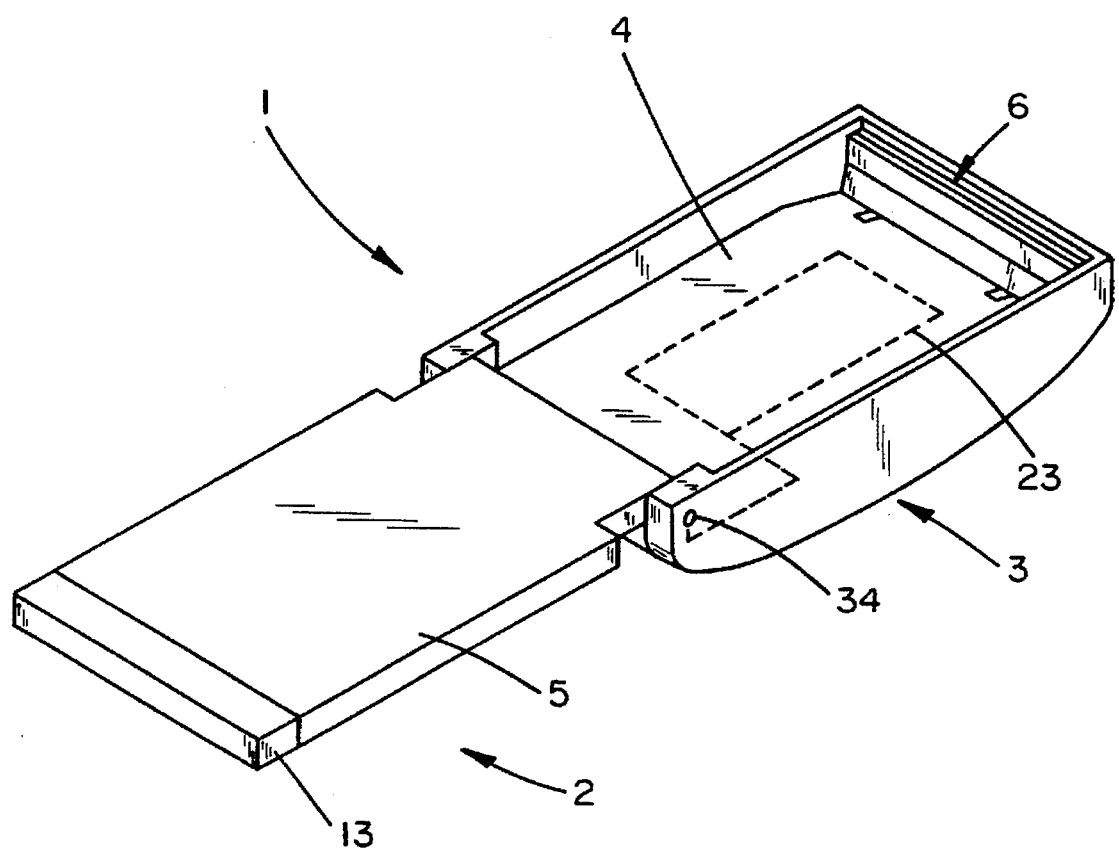
FIG. 2 is a perspective view showing a first embodiment of the present invention.

FIGS. 7A and 7B are partial sectional views illustrating the housing operation of the slot insertion section 2. Only by pressing the slot insertion section 2 from the above, the recess 13a can be fitted in the projection 31e so that the slot insertion section 2 can be easily housed and held in the housing 4. When the slot insertion section 2 is expanded, the slot insertion section 2 is held and pulled up with fingers at the curved sections provided on the sides of the case 21.

Accordingly, in the folding data communication device of this embodiment, the slot insertion section 2 can be easily housed with the simple arrangement.

A projection may be formed at each end of the interface connector 13, and a recess may be formed in the connector cover 31. In addition, in place of the above curved section, a notch may be formed in the inner surface of the case 21.

As described, since the folding data communication device can house the slot insertion section 2 in the housing 4 of the body 3, it can effectively protect the interface connector 13 from damage, by static electricity or external shock.

In addition, the slot insertion section 2 can be housed and held only by simple operation that the slot insertion section 2 and the body 3 are folded and overlapped with each other so that the operability and portability can be improved.

While the present invention has been described in connection with certain preferred embodiments. It is to be understood that the subject matter encompassed by the present invention is not limited to those specific embodiments. On the contrary, it is intended to include all alternatives, modifications, and equivalents as can be included within the spirit and scope of the following claims.

We claim:

1. A folding data communication device comprising a body, and a slot insertion section rotatably coupled to said body and inserted into a slot of an information processing device, wherein the body comprises a circuit board and a housing for housing the slot insertion section when the slot insertion section is rotated and folded, said housing being a case having an open side, the slot insertion section comprising an PC card section, and an interface connector, said interface connector of said slot insertion section being arranged within the case in the rotated and folded condition of said slot insertion section so as to be protectively covered from external shocks and damage from static electricity.

2. A folding data communication device as set forth in claim 1, wherein a connector protection cover is provided in the housing for housing the slot insertion section of the body at a location opposite to the interface connector when the slot insertion section is folded.

3. A folding data communication device as set forth in claim 2, wherein the connector protection cover is formed with an elastic material on its surface.

4. A folding data communication device as set forth in claim 2, wherein the connector protection cover is formed with a conductive material on its surface.

5. A folding data communication device as set forth in claim 2, wherein the connector protection cover is formed with a conductive rubber on its surface.

6. A folding data communication device as set forth in claim 2, wherein the connector protection cover is provided to be movable toward an open end of said housing.

7. A folding data communication device as set forth in claim 2, wherein the interface connector is formed with a recess or projection, while the connector protection cover is formed with a projection or recess at a location opposite to said recess or projection.

8. A folding data communication device as set forth in claim 2, wherein the communication device is a receiver and/or transmitter.

9. A folding data communication device as set forth in claim 8, wherein the device functions alone as a receiver and/or transmitter.

10. A folding data communication device as set forth in claim 1, wherein an antenna is installed on the slot insertion section and/or the body.

\* \* \* \* \*